(12) United States Patent
Johnson

(10) Patent No.: US 7,028,210 B2
(45) Date of Patent: Apr. 11, 2006

(54) SYSTEM AND METHOD FOR AUTOMATICALLY CORRECTING TIMERS

(75) Inventor: Charles Johnson, Gray, TN (US)

(73) Assignee: Siemens Energy & Automation, Inc., Alpharetta, GA (US)

( * ) Notice: Subject to any disclaimer, the term of this patent is extended or adjusted under 35 U.S.C. 154(b) by 295 days.

(21) Appl. No.: 10/441,856

(22) Filed: May 20, 2003

(65) Prior Publication Data

US 2004/0236976 A1 Nov. 25, 2004

(51) Int. Cl.
*G06F 13/36* (2006.01)

(52) U.S. Cl. ............ 713/500; 713/501; 713/502; 713/503; 713/710; 713/58; 713/107; 713/110; 713/113; 713/117

(58) Field of Classification Search ........ 713/500–503; 710/58, 107, 110, 113, 117
See application file for complete search history.

(56) References Cited

U.S. PATENT DOCUMENTS

| | | | |
|---|---|---|---|
| 6,360,277 B1* | 3/2002 | Ruckley et al. | 709/250 |
| 6,449,570 B1* | 9/2002 | Wilstrup et al. | 702/69 |
| 6,449,715 B1* | 9/2002 | Krivoshein | 713/1 |
| 6,600,964 B1* | 7/2003 | Hess et al. | 700/97 |
| 6,608,574 B1* | 8/2003 | Johnson | 341/116 |
| 6,813,664 B1* | 11/2004 | Koellner et al. | 710/117 |
| 2002/0099465 A1* | 7/2002 | Su | 700/121 |
| 2002/0131452 A1* | 9/2002 | Bruckner et al. | 370/494 |
| 2003/0099229 A1* | 5/2003 | Tretter et al. | 370/364 |
| 2003/0142696 A1* | 7/2003 | Holmeide et al. | 370/508 |
| 2004/0249982 A1* | 12/2004 | Arnold et al. | 709/248 |

* cited by examiner

*Primary Examiner*—A. Elamin

(57) ABSTRACT

As provided, a system and method for automatically correcting timers to improve timing accuracy. The system and method provides for the use of inexpensive low tolerance resonators or oscillators that meet the internal timing specifications of applications of isochronous I/O over Profibus. Accordingly, the specified error rate (jitter) to appropriately maintain I/O is met efficiently and at low cost.

18 Claims, 2 Drawing Sheets

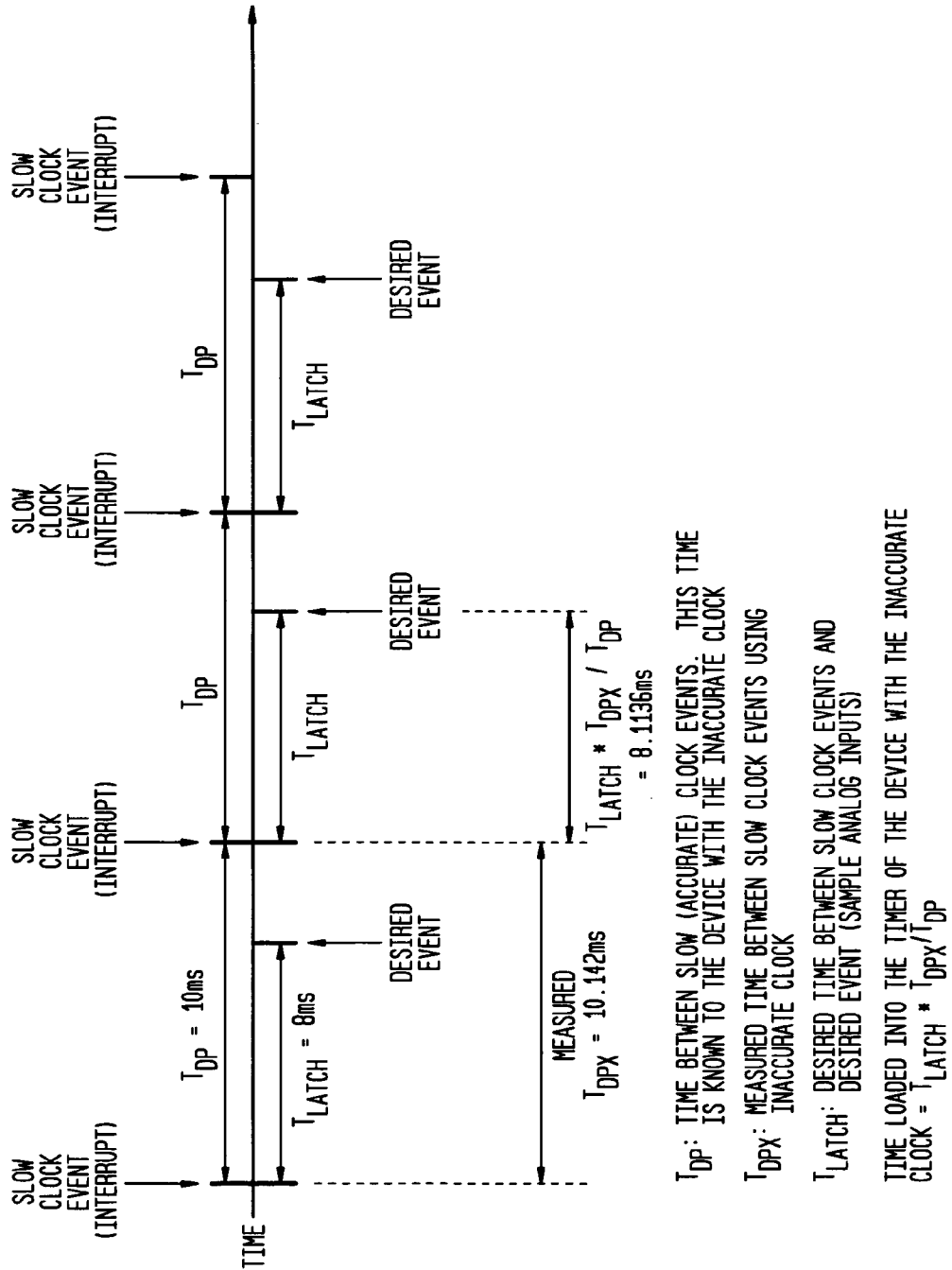

SYSTEM AND METHOD FOR AUTOMATICALLY CORRECTING TIMERS

BACKGROUND

Profibus is an industrial network which can have a constant time cycle. Isochronous I/O over Profibus, also referred to as equidistance or constant bus cycle time, requires internal timing specifications within a specified error rate (jitter). If the timing is not maintained within this proscribed error rate, I/O is negatively impacted. It will be appreciated that other industrial networks are adding the capability of a constant time cycle. Examples of other networks include DeviceNet & EthernetIp.

Conventional systems and methods that may achieve this proscribed error rate are both expensive and inefficient. For example, isochronous I/O provides an interrupt to the I/O module that is the timing reference for all synchronous activity. Thus, in one conventional system and method, a PLL could be implemented to track this periodic interrupt and to multiply it by a large factor to provide the timing for module samples. This method is an expensive way to achieve the timing requirements. In a second conventional system and method, a crystal oscillator could be used to provide a tighter tolerance time base for the module to meet these timing requirements. However, it is unacceptably expensive.

Therefore, there is a need for a system and method that efficiently and inexpensively meets the proscribed error rate of the internal timing specifications of isochronous I/O over Profibus.

BRIEF DESCRIPTION OF THE FIGURES

FIG. 2 is an example of the present invention.

SUMMARY

Figure 1:
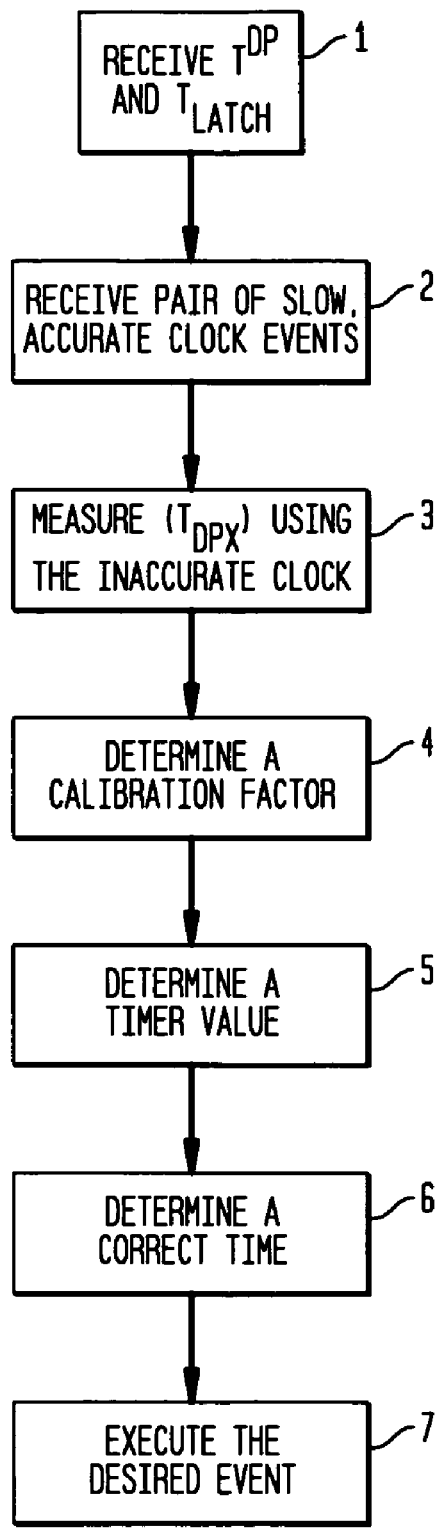
FIG. 1 is a flowchart of a system and method for correcting timers as provided in the present invention.

As provided, a system and method for automatically correcting timers to improve timing accuracy. The system and method provides for the use of inexpensive low tolerance resonators or oscillators that meet the internal timing specifications of applications of isochronous I/O over Profibus. Accordingly, the specified error rate (jitter) to appropriately maintain I/O is met efficiently and at low cost.

DETAIL

An embodiment of isochronous I/O over Profibus (also referred to as equidistance or constant bus cycle time) may be appreciated. As provided an implementation of the isochronous I/O may proscribe internal timing specification which requires module sample error (jitter) timing to be on the order of 10 microseconds.

Due to cost considerations, it is preferable to use a low tolerance resonator or other type of low tolerance oscillator provided within a microchip to maintain timing within the range of the error rate. However, a conventional low tolerance resonator or oscillator does not typically meet these timing requirements.

A conventional low tolerance resonator or oscillator generally provides for an error tolerance of approximately 1.4% due to initial tolerance, aging and temperature drift. Therefore, the 10 microsecond requirement will not be met. More specifically, I/O update times may range from 2 to 32 milliseconds and upwards of 4 seconds may occur in some systems. Further, time measured by the module may range from 1 to 30 milliseconds in typical applications, and extend even longer, up to 4 seconds in atypical applications. Therefore, a module that uses a resonator will generally be in error in such applications by 14 to 420 microseconds and by far greater times for atypical applications. Thus, use of a conventional low tolerance resonator does not meet the internal timing requirements or the isochronous I/O over Profibus.

The method as shown in FIG. 1 for achieving the timing requirements using a low tolerance resonator or oscillator are as follows:

1. Device including low tolerance resonator or oscillator (device with inaccurate clock) receives an established time constant between slow, accurate clock events ($T_{DP}$), and time between a selected slow clock event and a desired event ($T_{LATCH}$)
2. Device with inaccurate clock continuously receives slow, accurate clock events
3. Device with inaccurate clock measures the time between slow, accurate clock events ($T_{DPX}$) using the inaccurate clock
4. Device with inaccurate clock calculates a calibration factor (calibration factor=$T_{DPX}/T_{DP}$)
5. Device with inaccurate clock applies calibration factor to the desired event time (TIMER VALUE=$T_{LATCH}*T_{DPX}/T_{DP}$)
6. Device with inaccurate clock loads the timer clocked from the inaccurate clock, the TIMER VALUE, to determine the correct time to the desired event
7. Device with inaccurate clock executes desired event when the TIMER VALUE loaded into the timer times out Please note that step 1 occurs infrequently because ($T_{DP}$) is a constant, and ($T_{LATCH}$) remains a constant as long as it remains the selected event. Step 3 may be performed every slow clock period or sampled at a slower rate. Steps 4 and 5 should be performed in conjunction with Step 3.

As shown in FIG. 2, the following exemplifies an embodiment of the method described herein above. Please note that the steps are denoted by brackets.

An analog input module is a device that supports Isochronous I/O operations and uses a low tolerance resonator for its internal microcontroller. Therefore, it performs events based on an inaccurate timer. In step [1], this device receives $T_{DP}$ (I/O cycle time) and $T_{LATCH}$ (time between a selected slow clock event and a desired event). As provided in this example, the device receives a 10 millisecond $T_{DP}$ (I/O cycle time) and an 8 millisecond $T_{LATCH}$ (input sample time). This selection requires the module to time 8 milliseconds from the global control interrupt to the sample time of the analog input. As known, the device utilizes a resonator with an accuracy specification of +/−1.4% over time and temperature. Therefore, the resonator accuracy may cause an error in the sample time as great as 8 ms*1.4%=112 microseconds. A time of 112 microseconds exceeds the allowed error by a factor of 11.

In step [2], the inaccurate clock device receives a pair of slow, accurate clock events. The time between the slow accurate clock events as measured by an accurate clock is $T_{DP}$ In step [3], the device measures $T_{DPX}$, the time between the interrupts as measured by the inaccurate clock. Instead of measuring the time in this example, since the error rate of the resonator is known, it is possible to calculate $T_{DPX}$, the time between the interrupts as measured by the inaccurate clock. In this example, the resonator has an error rate of plus 1.4% (running faster than expected). Therefore, since $T_{DP}$ is 10 milliseconds, then $T_{DPX}$ is 10 ms/(100%−1.4%)=10.142 ms.

Next, in step [4] the calibration factor is determined. The calibration factor is equal to $T_{DPX}/T_{DP}$. In this example, the calibration factor is 10.142/10=1.0142. In step [5] the calibration factor is applied to the desired event time to yield a TIMER VALUE. The timer value is 8 ms*1.0142=8.1136 ms. In step [6], the device loads the TIMER VALUE into a timer running in the device having an inaccurate clock. In step [7], the device with the inaccurate clock performs the desired event at the TIMER VALUE. In this example, the timer in the device having the inaccurate clock (e.g. low tolerance resonator or oscillator) times out at 8.1136 ms. It will be appreciated that the TIMER VALUE of the inaccurate clock (8.1136 ms) correlates to the correct time of (8.0 ms) of an accurate clock. The difference is 1.4%.

It will be appreciated that if the measured $T_{DP}$ is less than expected then the inaccurate oscillator is running slower than expected. Thus the timer load calibration factor would be less than unity. If the measured $T_{DP}$ is greater than expected then the inaccurate oscillator is running faster than expected. The calibration factor would then be greater than unity.

I claim:

1. A method for correcting timers comprising:
   receiving a first time between slow, accurate clock events as measured by an accurate clock and a second time between a slow clock event and a desired event;
   receiving a pair of slow, accurate clock events;
   measuring a third time between the pair of slow, accurate clock events using an inaccurate clock;
   determining a calibration factor;
   determining a timer value based on the calibration factor; and
   using the timer value to determine a correct time to execute the desired event.

2. The method of claim 1 further comprising:
   executing the desired event at the timer value.

3. The method of claim 1, wherein the determining a calibration factor further includes:
   dividing a third time by a first time to determine the calibration factor.

4. The method of claim 2, wherein the determining a timer value further includes:
   multiplying the second time by the calibration factor to determine the timer value.

5. The method of claim 1, wherein the inaccurate clock is included within a resonator.

6. The method of claim 5, wherein the resonator is included within an analog input module.

7. The method of claim 1, wherein the inaccurate clock is provided within a oscillator.

8. The method of claim 7, wherein the oscillator is included within an analog input module.

9. The method of claim 1, wherein the method is provided over a network including Isochronous I/O over Profibus.

10. The method of claim 1, wherein the first time is a constant.

11. The method of claim 1, wherein the second time is a constant as long as the desired event remains.

12. The method of claim 1, wherein the measuring occurs for each slow clock period or is sampled at a slower rate.

13. The method of claim 1, wherein if the third time is less than expected then the inaccurate clock is running slower than expected and the calibration factor is less than unity.

14. The method of claim 1, wherein if the third time is greater than expected then the inaccurate clock is running faster than expected and the calibration factor is greater than unity.

15. An apparatus for correcting timers comprising:
   a first portion configured to receive a first time between slow, accurate clock events as measured by an accurate clock and a second time between a slow clock event and a desired event;
   a second portion configured to receive a pair of slow, accurate clock events;
   a third portion configured to measure a third time between the pair of slow, accurate clock events using an inaccurate clock;
   a fourth portion configured to determine a calibration factor;
   a fifth portion configured to determine a timer value based on the calibration factor; and
   a sixth portion configured to use the timer value to determine a correct time to execute the desired event.

16. The apparatus of claim 15 further comprising:
   a seventh portion configured to execute the desired event at the timer value.

17. A computer program product comprising:
   a computer usable medium having computer readable coded therein for correcting timers, the usable medium including:
   a first computer readable program code device configured to cause a computer to effect receiving a first time between slow, accurate clock events as measured by an accurate clock and a second time between a slow clock event and a desired event;
   a second computer readable program code device configured to cause a computer to effect receiving a pair of slow, accurate clock events;
   a third computer readable program code device configured to cause a computer to effect measuring a third time between the pair of slow, accurate clock events using an inaccurate clock;
   a fourth computer readable program code device configured to cause a computer to effect determining a calibration factor;
   a fifth computer readable program code device configured to cause a computer to effect determining a timer value based on the calibration factor; and
   a sixth computer readable program code device configured to cause a computer to effect using the timer value to determine a correct time to execute the desired event.

18. The computer program product as recited in claim 17 further comprising:
   a seventh computer readable program code device configured to cause a computer to effect a seventh portion configured to execute the desired event at the timer value.

* * * * *